(12) United States Patent
Jang et al.

(10) Patent No.: US 9,618,801 B2
(45) Date of Patent: Apr. 11, 2017

(54) DISPLAY DEVICE HAVING A FURROW STRUCTURE ON A LIGHT BLOCKING MEMBER

(71) Applicant: Samsung Display Co., Ltd., Yongin-si (KR)

(72) Inventors: Chang-Soon Jang, Seoul (KR); Hee Ra Kim, Seoul (KR); Yi Seop Shim, Suwon-si (KR); Chul Huh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/857,209

(22) Filed: Sep. 17, 2015

(65) Prior Publication Data

US 2016/0274402 A1    Sep. 22, 2016

(30) Foreign Application Priority Data

Mar. 19, 2015  (KR) .......................... 10-2015-0038458

(51) Int. Cl.
*G02F 1/1339*    (2006.01)
*G03F 1/32*    (2012.01)
(Continued)

(52) U.S. Cl.
CPC ........ *G02F 1/13394* (2013.01); *G02F 1/1368* (2013.01); *G02F 1/133345* (2013.01);
(Continued)

(58) Field of Classification Search
CPC ........... G02F 1/13394; G02F 1/133345; G02F 1/133512; G02F 1/1368
See application file for complete search history.

(56) References Cited

U.S. PATENT DOCUMENTS 6,407,783 B1 *  6/2002  Ohgawara ......... G02F 1/133512
349/110
7,825,998 B2 *  11/2010  Chen ................... G02F 1/13338
345/173

(Continued)

FOREIGN PATENT DOCUMENTS

JP    2009-058607    3/2009
KR    10-2007-0002421    1/2007
(Continued)

*Primary Examiner* — John C Ingham
*Assistant Examiner* — Gustavo Ramallo
(74) *Attorney, Agent, or Firm* — H.C. Park & Associates, PLC

(57) ABSTRACT

Exemplary embodiments relate to a display device, an optical mask, and a method for manufacturing a display device using the same. The display device including: a first substrate and a second substrate facing the first substrate; a thin film transistor disposed on the first substrate; a first insulating layer disposed on the thin film transistor; and a light blocking member disposed on the first insulating layer. The light blocking member includes a spacer for maintaining a cell gap between the first substrate and the second substrate and a main light blocking portion having an upper surface that is lower than an upper surface of the spacer, and the light blocking member further includes a furrow at a border between the spacer and the main light blocking portion, the furrow having a surface lower than the upper surface of the main light blocking portion.

13 Claims, 15 Drawing Sheets

(51) Int. Cl.
*G02F 1/1333* (2006.01)
*G02F 1/1368* (2006.01)
*G02F 1/1335* (2006.01)

(52) U.S. Cl.
CPC .......... *G02F 1/133512* (2013.01); *G03F 1/32* (2013.01); *G02F 2001/13396* (2013.01); *G02F 2001/13398* (2013.01)

(56) References Cited

U.S. PATENT DOCUMENTS

2013/0329155 A1\* 12/2013 Kwak ..................... G02F 1/136
 349/43
2015/0022766 A1\* 1/2015 Kim ................... G02F 1/13394
 349/106

FOREIGN PATENT DOCUMENTS

| KR | 10-2008-0082086 | 9/2008 |
| KR | 10-1182312 | 9/2012 |

\* cited by examiner

DISPLAY DEVICE HAVING A FURROW STRUCTURE ON A LIGHT BLOCKING MEMBER

CROSS-REFERENCE TO RELATED APPLICATION

This application claims priority from and the benefit of Korean Patent Application No. 10-2015-0038458, filed on Mar. 19, 2015, which is hereby incorporated by reference for all purposes as if fully set forth herein.

BACKGROUND

Field

Exemplary embodiments relate to a display device, an optical mask, and a method for manufacturing a display device using the same, and, more particularly, to a display device having a light blocking member and a thin film transistor provided on a same substrate, an optical mask, and a method for manufacturing a display device using the same.

Discussion of the Background

A display device such as a liquid crystal display (LCD) or an organic light emitting diode display includes a plurality of pixels including switching elements, a display panel on which a plurality of signal lines are provided, and a driver.

The liquid crystal display, one of the widely adopted display devices, includes at least one display panel on which a field generating electrode is formed and a liquid crystal layer. The liquid crystal display applies a voltage to the field generating electrode to rearrange liquid crystal molecules of the liquid crystal layer to control a light transmission and to display desired images.

For a liquid crystal display, which includes two display panels, the field generating electrodes may be respectively provided in the two display panels facing each other, or the two field generating electrodes may be disposed in one display panel. A pixel electrode of the field generating electrodes, to which a data voltage is applied, and a plurality of thin film transistors may be arranged in a matrix form in one of the display panels facing each other. A color filter for representing primary colors such as red, green, and blue and a light blocking member for preventing light leakage between pixels may be formed in the other display panel.

However, in the liquid crystal display described above, since the pixel electrode, the thin film transistors, and the color filter or the light blocking member are formed in the different display panels, it is difficult to make an accurate alignment between the pixel electrode and the color filter or between the pixel electrode and the light blocking member. Thus, a display apparatus employing such a configuration may have an alignment error, thereby causing defects or deteriorated display qualities.

To solve the problem, a structure for forming the light blocking member in the same display panel as the pixel electrode and the thin film transistor may be used. In such a configuration, the color filter may be formed in the same display panel as the pixel electrode. As such, the light blocking member may be integrally formed in the display panel in which the pixel electrode and the thin film transistor are formed, thereby achieving a high aperture ratio and high transmittance of the liquid crystal display.

When including the two display panels, the LCD may include a plurality of spacers for maintaining a cell gap between the two display panels. The plurality of spacers include a main spacer and a sub-spacer having a lower height than the main spacer. When an external pressure or force is applied to the LCD to cause the cell gap between the two display panels to be changed, the sub-spacer may serve to maintain the cell gap between the two display panels and to prevent deformation of the main spacer to the extent that the original shape of the main spacer cannot be recovered.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments disclose a display device, an optical mask, and a method for manufacturing a display device to reduce the number of optical masks used for forming a spacer in a display device manufacturing process for forming a light blocking member on a display panel on which a pixel electrode and a thin film transistor are provided.

Additional aspects will be set forth in the detailed description which follows, and, in part, will be apparent from the disclosure, or may be learned by practice of the inventive concept.

Exemplary embodiments disclose a display device, an optical mask, and a method for manufacturing a display device to form a small spacer to easily form the spacer on a high-resolution display device in a manufacturing process for forming a light blocking member and a spacer using an optical mask and a display device manufactured by using the manufacturing process.

An exemplary embodiment discloses a display device including: a first substrate and a second substrate facing the first substrate; a thin film transistor disposed on the first substrate; a first insulating layer disposed on the thin film transistor; and a light blocking member disposed on the first insulating layer. The light blocking member includes a spacer for maintaining a cell gap between the first substrate and the second substrate and a main light blocking portion having an upper surface that is lower than an upper surface of the spacer, and the light blocking member further includes a furrow at a border between the spacer and the main light blocking portion, the furrow having a surface lower than the upper surface of the main light blocking portion.

An exemplary embodiment also discloses a method for manufacturing a display device, including: forming a thin film transistor on a first substrate; forming a first insulating layer on the thin film transistor; and coating a light blocking material layer on the first insulating layer and exposing the light blocking material layer using an optical mask. The optical mask includes: an island-type first region for transmitting at least a portion of light: a plurality of ring-type opaque regions provided around the first region and separated from each other: and a second region provided between the plurality of ring-type opaque regions and transmitting at least a portion of light.

An exemplary embodiment also discloses an optical mask for manufacturing a display device, including: an island-type first region configured to transmit at least a portion of light; a plurality of ring-type opaque regions provided around the island-type first region and separated from each other; and a second region provided between the plurality of ring-type opaque regions and configured to transmit at least a portion of light.

According to an exemplary embodiment, the number of optical masks for forming a spacer may be reduced in a display device manufacturing process for forming a light blocking member on a display panel on which a pixel electrode and a thin film transistor are provided.

According to an exemplary embodiment, a smaller spacer may be formed by a single optical mask to easily form the spacer for high-resolution display devices in a manufacturing process for forming a light blocking member and a spacer using an optical mask and a display device manufactured by using the manufacturing process.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
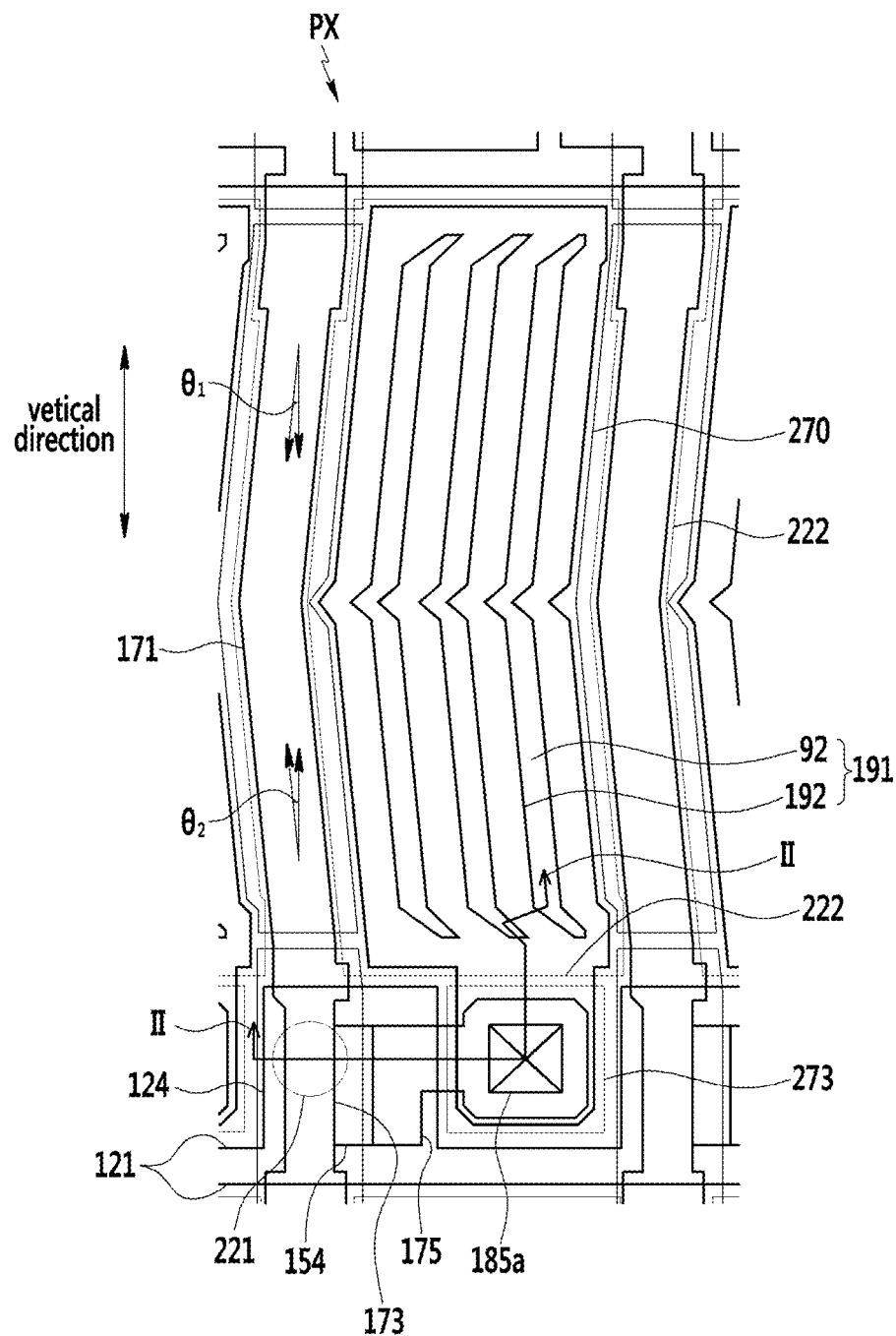
FIG. 1 shows a layout view of a pixel of a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
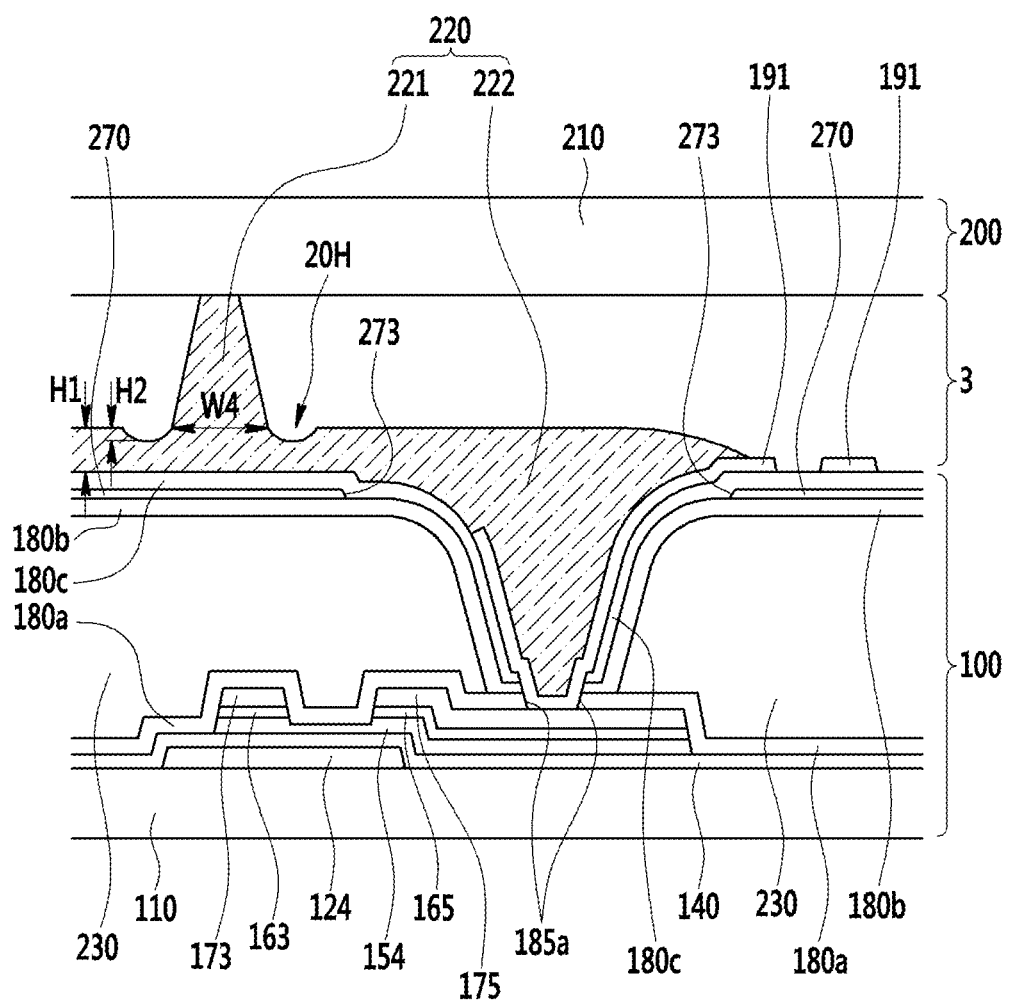
FIG. 2 is a cross-sectional view of a display device shown in FIG. 1 with respect to a section line II-II according to an exemplary embodiment.

FIG. 1 shows a layout view of a pixel of a display device according to an exemplary embodiment, and FIG. 2 is a cross-sectional view of a display device shown in FIG. 1 with respect to section line II-II according to an exemplary embodiment.

Referring to FIG. 1 and FIG. 2, the display device includes a lower panel 100 and an upper panel 200 facing each other, and a liquid crystal layer 3 provided therebetween.

The upper panel 200 includes a substrate 210 including transparent glass or plastic. An alignment layer (not shown) may be coated on an internal side of the substrate 210. The alignment layer may be a horizontal alignment layer. The alignment layer may be rubbed in a predetermined direction. However, the alignment layer may include a photo-reactive material and may be photo-aligned.

Regarding the lower panel 100, a gate conductor including a plurality of gate lines 121 is provided on an insulation substrate 110 including transparent glass or plastic.

The gate line 121 may transmit a gate signal and may mainly extend in a substantially horizontal direction. The gate line 121 includes a gate electrode 124. The gate line 121 may be made of or include an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), and the like. The gate line 121 may have a multilayered structure including at least two conductive layers with different physical properties.

A gate insulating layer 140 including a silicon nitride ($SiN_x$) or a silicon oxide ($SiO_x$) is provided on the gate conductor. The gate insulating layer 140 may have a multilayered structure including at least two insulating layers with different physical properties.

A semiconductor 154 is provided on the gate insulating layer 140. The semiconductor 154 may include amorphous silicon, polycrystalline silicon, or a metal oxide.

Ohmic contacts 163 and 165 may be provided on the semiconductor 154. The ohmic contacts 163 and 165 may be made of or include a material such as n+ hydrogenated amorphous silicon or the like in which an n-type impurity such as phosphorus or the like is doped in a high concentration, or may be made of a silicide. The ohmic contacts 163 and 165 may be paired to be disposed on the semiconductor 154. If the semiconductor 154 is an oxide semiconductor, the ohmic contacts 163 and 165 may be omitted.

A data line 171 including a source electrode 173 and a data conductor including a drain electrode 175 are provided on the ohmic contacts 163 and 165, respectively, and the gate insulating layer 140.

The data line 171 may transmit a data signal and may extend in a direction perpendicular to the gate line 121 to cross it. The data line 171 is insulated from the gate line 121.

The data line 171 may be bent periodically to improve transmittance. According to an exemplary embodiment, the data line 171 may include a plurality of bent portions, each of which are disposed to have a regular interval between two adjacent bent portions. For example, as shown in FIG. 1, the data line 171 may be bent at a portion corresponding to a horizontal center line (not shown) of one pixel PX and other pixels. The angles $\theta_1$ and $\theta_2$ between the data line 171 and the vertical direction in FIG. 1 may be about 5 to about 7 degrees, but the angle is not limited thereto. The data line 171 may be bent at least once again near the horizontal center line or more, and the angle between the data line 171 provided near the horizontal center line and the vertical direction in the drawing may be about 7 to about 15 degrees, but the angle is not limited thereto.

The data line 171 includes a source electrode 173. According to an exemplary embodiment, as shown in FIG. 1, the source electrode 173 may not be protruded from the data line 171 and may be provided as a portion of the data line 171.

The drain electrode 175 faces the source electrode 173. The drain electrode 175 may include a bar-type portion substantially extending in parallel with the source electrode 173 and an extension provided on an opposite side of the bar-type portion.

The data conductor may be made of a refractory metal such as molybdenum, chromium, tantalum, and titanium, or an alloy thereof, and may have a multi-layer structure including a refractory metal layer (not shown) and a low resistance conductive layer (not shown). Examples of the multi-layer structure include a double layer of a chromium or molybdenum (alloy) lower layer and an aluminum (alloy) upper layer, and a triple layer of a molybdenum (alloy) lower layer, an aluminum (alloy) intermediate layer, and a molybdenum (alloy) upper layer. The data line 171 and the drain electrode 175 may be made of various kinds of metals or conductors in addition to the materials described above.

The gate electrode 124, the source electrode 173, and the drain electrode 175 form a thin film transistor (TFT) together with the semiconductor 154, and a channel of the thin film transistor is formed on the semiconductor 154 between the source electrode 173 and the drain electrode 175.

A first insulating layer 180a may be provided on the data conductor, the gate insulating layer 140, and an exposed portion of the semiconductor 154. The first insulating layer 180a may include an organic insulating material or an inorganic insulating material.

A color filter 230 may be provided on the first insulating layer 180a. The color filter 230 may properly express one of primary colors. Examples of the primary colors may include three primary colors such as red, green, and blue and three primary colors such as yellow, cyan, and magenta, or four primary colors. According to an exemplary embodiment, the color filter 230 may further include a color filter displaying a mixed color of the primary colors or white in addition to the primary colors. The color filter 230 may extend along a pixel column or a pixel row.

The color filter 230 may include an opening (not shown) provided on an extension of the drain electrode 175.

A second insulating layer 180b may be provided on the color filter 230. The second insulating layer 180b may be made of an inorganic insulating layer or an organic insulator, may prevent the color filter 230 from being exposed as an overcoat for the color filter 230, and may provide a flat surface. The second insulating layer 180b may prevent an impurity such as a pigment of the color filter 230 from flowing into the liquid crystal layer 3. The second insulating layer 180b may be omitted according to a certain configuration.

A common electrode 270 may be provided on the second insulating layer 180b. The common electrode 270 may have a substantially planar shape, and may be formed as an entire surface on a front side of the substrate 110. The common electrode 270 provided on neighboring pixels PX may be connected with each other to apply a common voltage Vcom with a predetermined value. The common electrode 270 may be made of a transparent conductive material, such as indium tin oxide (ITO) or indium zinc oxide (IZO).

The common electrode 270 may have an opening 273 corresponding to the extension of the drain electrode 175.

A third insulating layer 180c may be provided on the common electrode 270. The third insulating layer 180c may be made of an organic insulating material or an inorganic insulating material.

The first insulating layer 180a, the second insulating layer 180b, and the third insulating layer 180c may include a contact hole 185a for exposing a portion of the drain electrode 175. As shown, the contact hole 185a may be provided in the opening 273 of the common electrode 270. For example, the opening 273 of the common electrode 270 may be larger than the contact hole 185a such that the opening 273 of the common electrode 270 surrounds the contact hole 185a when viewed from the direction perpendicular to the top surface of the substrate 110.

A pixel electrode 191 may be provided on the third insulating layer 180c. The pixel electrode 191 may include a plurality of branch electrodes 192 overlapping the common electrode 270, a connector (not shown) for connecting ends of the branch electrodes 192, and a protrusion (not shown) for accessing another layer A slit 92 from which the electrode material is removed is formed among the neighboring branch electrodes 192 of the pixel electrode 191.

The branch electrodes 192 of the pixel electrode 191 may substantially extend in parallel to the data line 171. A plurality of branch electrodes 192 of the pixel electrode 191 may be inclined with an oblique angle with respect to the vertical direction in FIG. 1, and may be bent at a horizontal center line (not shown) of the pixel electrode 191 in a like manner of the data line 171. The pixel electrode 191 may be divided into a plurality of domains with different inclined directions of the branch electrode 192 with reference to the horizontal center line of the pixel PX. For example, the branch electrode 192 at an upper side with reference to the horizontal center line may extend in a top-right direction and the branch electrode 192 at a lower side with reference to the horizontal center line may extend in a bottom-right direction as shown in FIG. 1. However, aspects are not limited as such. For example, the branch electrode 192 at an upper side with reference to the horizontal center line may extend in a top-left direction and the branch electrode 192 at a lower side with reference to the horizontal center line may extend in a bottom-left direction.

A protrusion of the pixel electrode 191 may be physically and electrically connected to the drain electrode 175 through the contact hole 185a of the first insulating layer 180a, the second insulating layer 180b, and the third insulating layer 180c, and may be supplied with a voltage from the drain electrode 175.

The pixel electrode 191 may be made of a transparent conductive material such as ITO or IZO.

According to an exemplary embodiment, stacked positions of the pixel electrode 191 and the common electrode 270 may be exchangeable. More specifically, the pixel electrode 191 may be provided on the second insulating layer 180b, the third insulating layer 180c may be disposed on the pixel electrode 191, and the common electrode 270 may be disposed on the third insulating layer 180c. In this case, the contact hole 185a may not be formed in the third insulating layer 180c (but only formed in the first insulating layer 180a and the second insulating layer 180b), and the common electrode 270 may not have the opening 273. Further, the pixel electrode 191 may be a planar shape occupying most of the region of the pixel PX, and the common electrode 270 may include a plurality of branch electrodes (not shown) overlapping the pixel electrode 191.

Unlike FIG. 2, the pixel electrode 191 may be provided on the lower panel 100 and the common electrode 270 may be provided on the upper panel 200. A configuration and a disposition of the pixel electrode 191 and the common electrode 270 may be changeable in various ways without being restricted to the illustrated drawings.

A light blocking member 220 may be provided on the pixel electrode 191. The light blocking member 220 may be a black matrix and it may prevent light leakage among the pixels PX. The light blocking member 220 may include a pigment such as black carbon, and may include an organic material with photosensitivity.

Referring to FIG. 2, the light blocking member 220 may include portions with different thicknesses. More specifically, the light blocking member 220 may include a spacer 221 and a main light blocking portion 222.

An upper surface of the main light blocking portion 222 is lower than an upper surface of the spacer 221. The main light blocking portion 222 includes a portion for covering the gate line 121 and substantially extending parallel to the gate line 121, and may further include a portion for covering the data line 171 and substantially extending parallel to the data line 171.

The main light blocking portion 222 may include a portion for covering the thin film transistor, and may include a portion for covering the contact hole 185a, which exposes a portion of the drain electrode 175. Therefore, the main light blocking portion 222 may fill a large step or a large recess provided near the contact hole 185a to flatten the surface. The main light blocking portion 222 for covering the contact hole 185a may prevent the light leakage occurring at surroundings of the contact hole 185a. The light blocking member 220 for covering the data line 171 may be omitted according to a certain configuration.

The upper surface of the main light blocking portion 222 on which the spacer 221 is not provided may be substantially flat.

The main light blocking portion 222 may be about 1 μm to about 2.5 μm tall, but the height of the main light blocking portion 222 is not limited thereto.

The spacer 221 may maintain a cell gap between the lower panel 100 and the upper panel 200. The spacer 221 may be a main spacer or a sub-spacer that is lower than the main spacer.

The main spacer may maintain and support the cell gap between the upper panel 200 and the lower panel 100 under a general condition. If the spacer 221 is a main spacer, an upper surface of the spacer 221 may almost reach a side of the upper panel 200. In this instance, the height of the spacer 221 from the bottom to the top may be about 2.5 μm to about 4.0 μm.

If an external pressure is applied to the display device, the sub-spacer maintains the cell gap between the upper panel 200 and the lower panel 100 to support the main spacer. The sub-spacer may function to prevent the main spacer from being deformed and failing to be restored into its original shape or state. If the spacer 221 is a sub-spacer, the upper surface of the spacer 221 may maintain a distance from the side of the upper panel 200. In this instance, the height of the spacer 221 from the bottom to the top may be about 2.0 μm to about 3.5 μm.

The width W4 of the spacer 221 may be about 5 μm to about 15 μm, but the width is not limited thereto. The spacer 221 may be connected to the main light blocking portion 222.

The spacer 221 may overlap a thin film transistor and/or a signal line such as the gate line 121 or the data line 171 connected to the thin film transistor.

Referring to FIG. 2, a furrow 20H may be provided on an edge of the spacer 221. The furrow 20H may be formed along the edge of the spacer 221, e.g., the border between the spacer 221 and the main light blocking portion 222, and it may form a closed curve surrounding the spacer 221. The furrow 20H may be a circular furrow surrounding the spacer 221.

The furrow 20H may be formed to be lower than an upper surface of the main light blocking portion 222 provided near the furrow 20H, and the depth H2 of the furrow 20H may be equal to or less than 25% the thickness H1 of the main light blocking portion 222 with reference to the upper surface of the main light blocking portion 222.

The spacer 221 may be formed by using one optical mask in the process for manufacturing a display device including the main light blocking portion 222 for preventing light leakage and the spacer 221. In this case, the optical mask may include a transmitting region through which the light transmits, a non-transmitting region for blocking the light, and a half-tone region through which a portion of the light transmits, and the half-tone region may correspond to the main light blocking portion 222.

If the color filter 230, the light blocking member 220, and the thin film transistor are provided on the lower panel 100, it is easy to align the light blocking member 220 and the color filter 230 and align the pixel electrode 191 and the thin film transistor to reduce alignment errors. Therefore, the light leakage or deterioration of the aperture ratio of the liquid crystal display caused by the misalignment among the constituent elements may be prevented and transmittance may not decrease.

An alignment layer may be coated on the light blocking member 220. The alignment layer may be a horizontal alignment layer. The alignment layer may be rubbed in a predetermined direction. According to an exemplary embodiment, the alignment layer may include a photo-reactive material and may be photo-aligned.

The liquid crystal layer 3 includes liquid crystal molecules (not shown) having dielectric anisotropy. The liquid crystal molecules may be aligned so that long axes thereof are parallel to the top surfaces of the panels 100 and 200 when an electric field is not applied to the liquid crystal layer 3, and in this case, the liquid crystal molecules may have positive dielectric anisotropy.

The liquid crystal molecules may be nematic liquid crystal molecules of which a long-axis direction is spirally twisted up to the upper display panel 200 from the lower display panel 100. While no electric field is applied to the liquid crystal layer 3, a long axis of the liquid crystal molecules may be substantially perpendicularly aligned with respect to the top surface of the display panels 100 and 200, and the liquid crystal molecules may have negative dielectric anisotropy. In this case, the disposition and the configuration of the pixel electrode 191 and the common electrode 270 may be changed, which are different from the configuration illustrated in FIG. 1 and FIG. 2.

The pixel electrode 191 may be supplied with a data voltage from the thin film transistor, and the common electrode 270 may be supplied with a common voltage Vcom. Then, the pixel electrode 191 and the common electrode 270 as two field generating electrodes generate an electric field in the liquid crystal layer 3, and as a result, the liquid crystal molecules of the liquid crystal layer 3 positioned between the two electrodes 191 and 270 are rearranged. Polarization of light passing through the liquid crystal layer 3 varies according to the rearranged liquid crystal molecules, and an image of desired luminance may be displayed. The branch electrodes 192 of the pixel electrode 191 illustrated in FIG. 1 and FIG. 2 form a fringe field in the liquid crystal layer 3 together with the common electrode 270 to determine alignment directions of the liquid crystal molecules. Accordingly, when the branch electrodes 192 included in one pixel electrode 191 have different directional slopes, tilt directions of the liquid crystal molecules are various, and as a result, a reference viewing angle of the liquid crystal display may be enlarged.

A method for manufacturing a display device according to an exemplary embodiment will be described with reference to FIG. 3 to FIG. 6 together with the above-described drawings.

Figure 3:
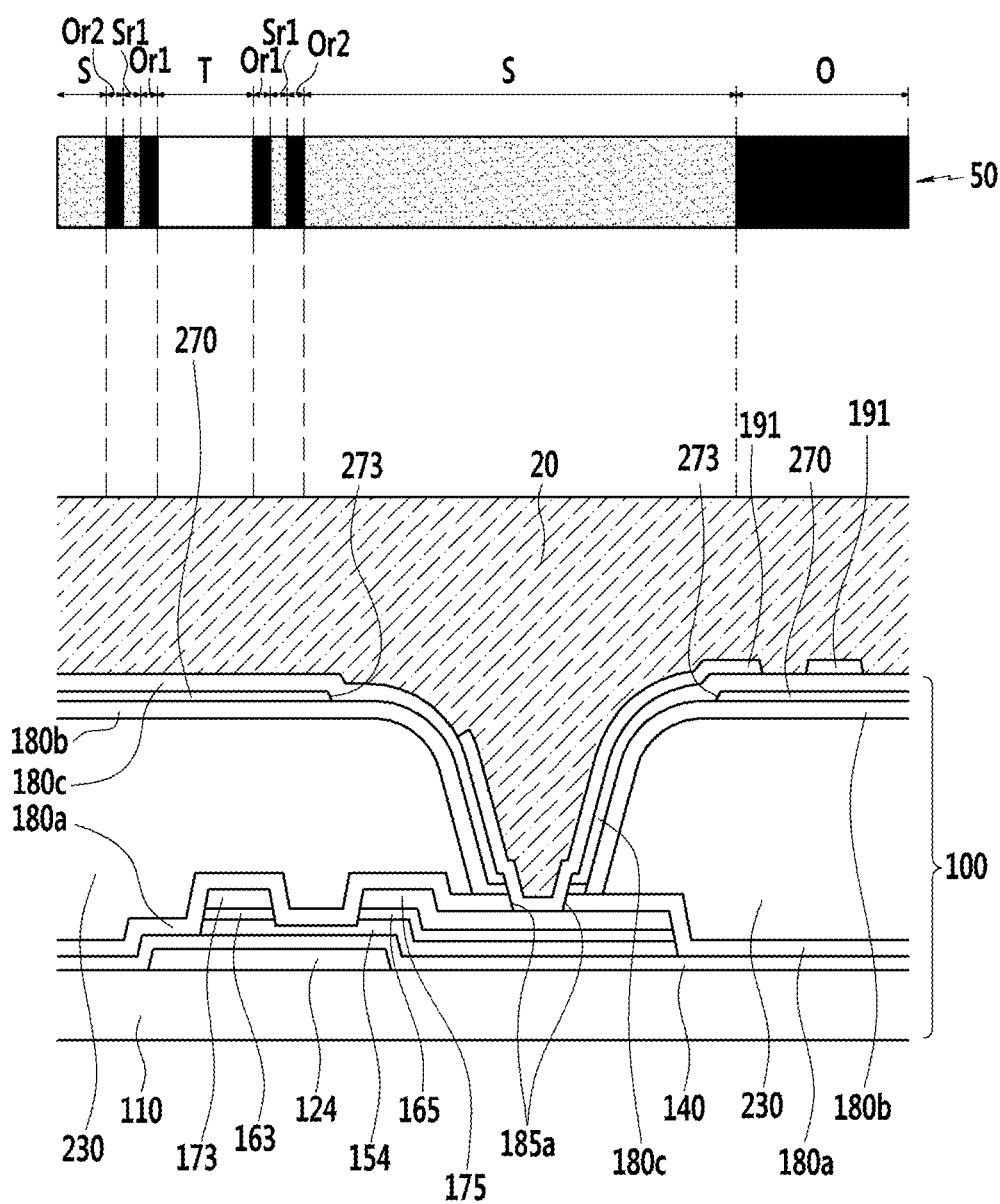
FIG. 3 shows a cross-sectional view of an intermediate product with respect to a section line II-II shown in FIG. 1 in one stage of a manufacturing process of a display device according to an exemplary embodiment.
Figure 4:
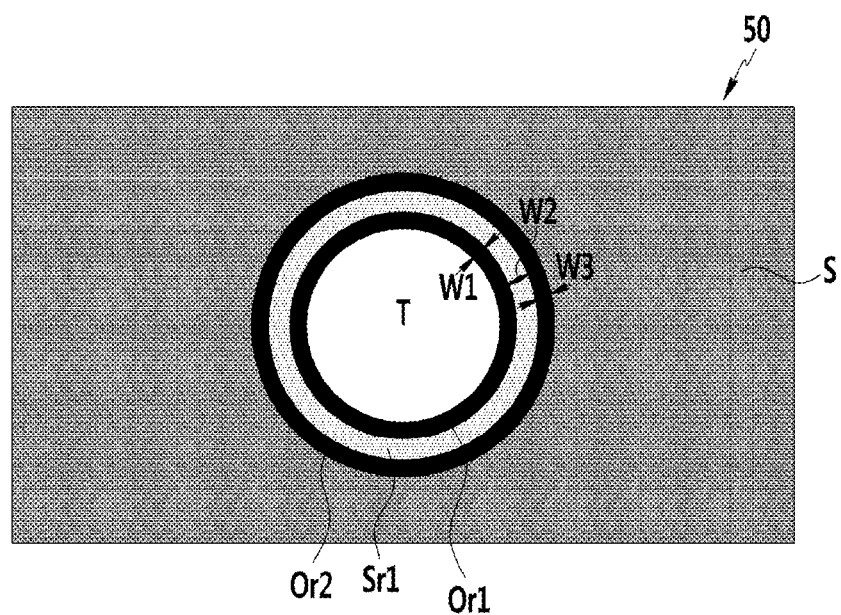
FIG. 4 shows transmittance of an optical mask used for forming a light blocking member in a manufacturing process of a display device according to an exemplary embodiment.
Figure 5:
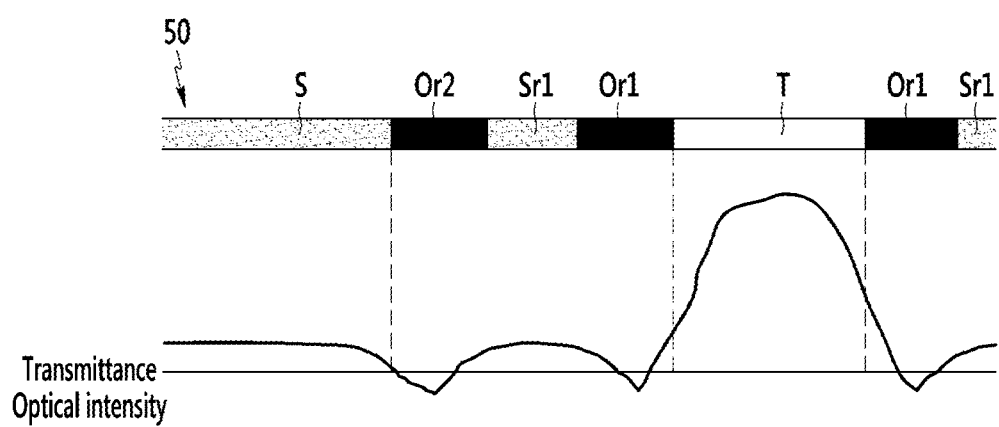
FIG. 5 shows an optical mask used for forming a light blocking member in a manufacturing process of a display device, and intensity of light passing through the optical mask, according to an exemplary embodiment.
Figure 6:
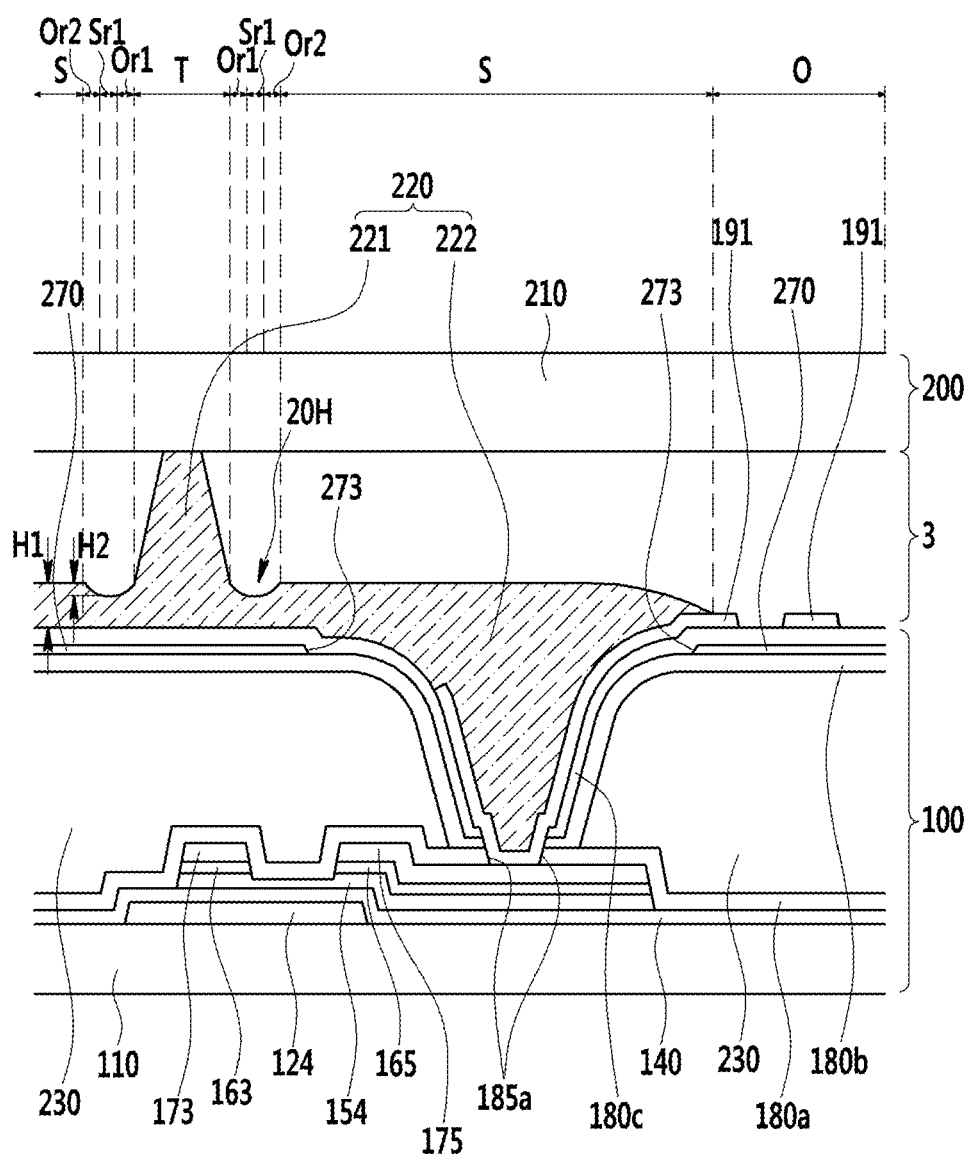
FIG. 6 shows a cross-sectional view of an optical mask used for forming a light blocking member in a manufacturing process of a display device, and a display device including a light blocking member formed corresponding to the optical mask with respect to the line II-II shown in FIG. 1, according to an exemplary embodiment.

FIG. 3 shows a cross-sectional view of an intermediate product with respect to section line II-II shown in FIG. 1 in one stage of a manufacturing process of a display device according to an exemplary embodiment, FIG. 4 shows transmittance of an optical mask used for forming a light blocking member in a manufacturing process of a display device according to an exemplary embodiment, FIG. 5 shows an optical mask used for forming a light blocking member in a manufacturing process of a display device, and intensity of light passing through the optical mask, according to an exemplary embodiment, and FIG. 6 shows a cross-sectional view of an optical mask used for forming a light blocking member in a manufacturing process of a display device, and a display device including a light blocking member formed corresponding to the optical mask with respect to section line II-II shown in FIG. 1, according to an exemplary embodiment.

Referring to FIG. 3, a conductive material is stacked and patterned on the substrate 110. The substrate may be made of glass or plastic.

An insulating material such as an inorganic insulating material or an organic insulating material may be stacked on the gate conductor to form a gate insulating layer 140.

A semiconductor material and a conductive material may be sequentially stacked and patterned on the gate insulating layer 140 to form the semiconductor 154 and a data conductor including the data line 171 and the drain electrode 175. Here, an exposure process using an optical mask including a half-tone region may be used.

An organic insulating material or an inorganic insulating material may be stacked on the data conductor and the exposed portion of the semiconductor 154 to form a first insulating layer 180a.

A color filter material may be coated on the first insulating layer 180a, and may be exposed and developed to form a plurality of color filters 230.

An insulating material may be stacked on the color filter 230 to form a second insulating layer 180b.

A transparent conductive material, such as ITO or IZO, may be stacked and patterned on the second insulating layer 180b to form a common electrode 270.

An organic insulating material or an inorganic insulating material may be stacked on the common electrode 270 to form a third insulating layer 180c.

The first insulating layer 180a, the second insulating layer 180b, and the third insulating layer 180c may be patterned to form a contact hole 185a for exposing a portion of the drain electrode 175.

A conductive material, such as ITO or IZO, may be stacked and patterned on the third insulating layer 180c to form a plurality of pixel electrodes 191.

A light blocking material may be coated on the pixel electrode 191 to form a light blocking material layer 20. The thickness of the light blocking material layer 20 may be about 3.5 μm to about 6.5 μm, but the thickness is not limited thereto.

The light blocking material layer 20 may be exposed by using an optical mask 50 as shown in FIG. 3 and FIG. 4.

The optical mask 50 includes a plurality of regions with different values of transmittance, and the plurality of regions may indicate at least three different values of transmittance. The plurality of regions may include a transparent region T having the greatest light transmittance, at least one half-tone region S for transmitting a portion of the light, and an opaque region O having the least light transmittance. For example, the transparent region T may allow most of the light to be transmitted so its light transmittance may be substantially 100%, the opaque region O may block most of incident light so its light transmittance may be substantially 0%, and the light transmittance of the half-tone region S may be about 20%, for example.

The transparent region T of the optical mask 50 may be an island type and correspond to a region in which the above-described spacer 221 (see FIG. 2) will be formed. The width of the transparent region T corresponding to the region in which the spacer 221 will be formed may be about 5 μm to about 15 μm, but the width is not limited thereto.

The half-tone region S of the optical mask 50 includes a main portion corresponding to a region in which a main light blocking portion 222 (see FIG. 2) will be formed.

The opaque region O of the optical mask 50 may include most of the region in which the pixel electrode 191 will be formed, that is, a portion that corresponds to a transmission region of the pixel PX. Further, the opaque region O of the optical mask 50 includes a plurality of ring-type opaque regions Or1 and Or2 formed along surroundings of the transparent region T corresponding to the region in which the spacer 221 will be formed.

As shown in FIG. 3 and FIG. 4, the ring-type opaque regions Or1 and Or2, which are formed along the surroundings of the transparent region T and separated from each other, may include a first ring-type opaque region Or1 formed along the surroundings of the transparent region T and a second ring-type opaque region Or2 separated from the first ring-type opaque region Or1 and provided to an external side of the first ring-type opaque region Or1. As shown in FIG. 4, the second ring-type opaque region Or2 may surround the first ring-type opaque region Or1. The ring-type opaque regions Or1 and Or2 formed along the surroundings of the transparent region T may be provided between the transparent region T and the half-tone region S. An example in which two separated ring-type opaque regions Or1 and Or2 are provided on the surroundings of the transparent region T will be described in more detail.

The ring-type opaque regions Or1 and Or2 correspond to a furrow 20H to be formed in the surroundings of the spacer 221. The ring-type opaque regions Or1 and Or2 may form a closed curve to surround the transparent region T.

A width W1 of the first ring-type opaque region Or1 and a width W3 of the second ring-type opaque region Or2 may be substantially greater than 0 μm and equal to or less than about 2 μm. The width W1 of the first ring-type opaque region Or1 and the width W3 of the second ring-type opaque region Or2 may be the same or may be different from each other.

The half-tone region S further includes at least one intermediate half-tone region Sr1 provided between the ring-type opaque regions Or1 and Or2. According to an exemplary embodiment, the intermediate half-tone region Sr1 may be provided between the first ring-type opaque region Or1 and the second ring-type opaque region Or2 and forms a closed curve, e.g., a ring.

The intermediate half-tone region Sr1 corresponds to the furrow 20H to be formed in the surroundings of the spacer 221 together with the first and second ring-type opaque regions Or1 and Or2. The halftone region Sr1 may form a closed curve as noted above if the first and second ring-type opaque regions Or1 and Or2 form closed curves.

A width W2 of the intermediate half-tone region Sr1 may be substantially greater than 0 μm and equal to or less than about 2 μm. The width W2 of the intermediate half-tone region Sr1 may be the same as or different from the width W1 of the first ring-type opaque region Or1 or the width W3 of the second ring-type opaque region Or2.

The main portion of the halftone region S may be provided to external sides of the second ring-type opaque region Or2 provided to the outermost side among the first and second ring-type opaque regions Or1 and Or2 and the intermediate half-tone region Sr1.

According to an exemplary embodiment, the transparent region T of the optical mask 50 corresponding to the region in which the spacer 221 will be formed may not be transparent but may allow a portion of the light to be transmitted in a like manner of the halftone region S. For example, the island-type transparent region T may have substantially the same transmittance as the main portion of the halftone region S.

According to an exemplary embodiment, the intermediate half-tone region Sr1 may be a transparent region for allowing most of the light to be transmitted therethrough in a like manner of the transparent region T.

In this configuration, the light blocking material layer 20 may have negative photosensitivity that remains when irradiated by the incident light. Alternatively, if the light blocking material layer 20 is to be configured to have positive photosensitivity, transparency of the above-described optical mask 50 may be changed to the opposite.

Referring to FIG. 5, when the light is irradiated on the light blocking material 20 through the optical mask 50, intensity of the light having passed through the transparent region T is the greatest, intensity of the light having passed through the half-tone region S and the intermediate half-tone region Sr1 is lower than the intensity of the light having passed through the transparent region T, and intensity of the light having passed through the ring-type opaque regions Or1 and Or2 is the lowest. Further, the ring-type opaque regions Or1 and Or2 may be relatively more transparent than the opaque region O.

When the light blocking material layer 20 is exposed and developed through the optical mask 50, the light blocking material layer 20 corresponding to the transparent region T mostly remains, the light blocking material layer 20 corresponding to the opaque region O including the ring-type opaque regions Or1 and Or2 is mostly removed, and the light blocking material layer 20 corresponding to the half-tone region S including the intermediate half-tone region Sr1 is partly removed. Accordingly, the spacer 221 is formed in the region corresponding to the transparent region T, the furrow 20H is formed in the region corresponding to the first and second ring-type opaque regions Or1 and Or2 and the intermediate half-tone region Sr1, the main light blocking portion 222 is formed in the region corresponding to the half-tone region S, and the light blocking material layer 20 of the region corresponding to the opaque region O excluding the first and second ring-type opaque regions Or1 and Or2 is removed to correspond to the transmission region of the pixel PX. In a microscopic view, the furrow 20H may have a shape of two furrows having a small protrusion between the two furrows as shown in FIG. 5. Although the intermediate half-tone region Sr1 has a higher transmission ratio than the first and second ring-type opaque regions Or1 and Or2, because of the relatively narrow widths of the intermediate half-tone region Sr1 and the first and second ring-type opaque regions Or1 and Or2, the furrow formed by the intermediate half-tone region Sr1 and the first and second ring-type opaque regions Or1 and Or2 may look like the furrow shown in FIG. 9(*c*), which is a relatively shallow furrow in comparison with the furrow shown in FIG. 8(*c*).

According to the above-described configuration, the spacer 221 and the main light blocking portion 222 are formed by using one optical mask 50 thereby reducing a cost for the optical mask, compared to the conventional art for forming a spacer and a main light blocking portion by respectively using a plurality of optical masks, and reducing a production cost of the display device and simplifying the manufacturing process.

At least one of ring-type opaque regions Or1 and Or2 is formed around the transparent region T of the optical mask 50 corresponding to the spacer 221 and is then exposed, and the light blocking material layer 20 on the surroundings of the spacer 221 is removed to form the width W4 of the spacer 221 as shown in FIG. 2 and reduce the horizontal-directional size of the spacer 221. Therefore, the spacer 221 may be easily formed because the smaller spacer 221 can be formed in the high-resolution display device according to the manufacturing process described above.

Further, the intermediate half-tone region Sr1 may be provided between the ring-type opaque regions Or1 and Or2, which are provided around the transparent region T of the optical mask 50, so a depth of the furrow 20H from which the light blocking material layer 20 on the surroundings of the spacer 221 may be reduced by the irradiated light. More specifically, the depth H2 of the furrow 20H may be reduced to be equal to or less than about 25% of the thickness H1 of the main light blocking portion 222 with reference to the upper surface of the main light blocking portion 222 to prevent the main light blocking portion 222 on the surroundings of the spacer 221 from becoming excessively thin. Therefore, the thickness of the main light blocking portion 222 may be formed to be constant to a certain degree thereby preventing display faults such as light leakage that may occur when the main light blocking portion 222 becomes partly thin. The configuration described above may be easily applied to a high-resolution display device with relatively small pixels PX since the spacer 221 may need to be maintained small in its size for the high-resolution display device as described.

Figure 7A:
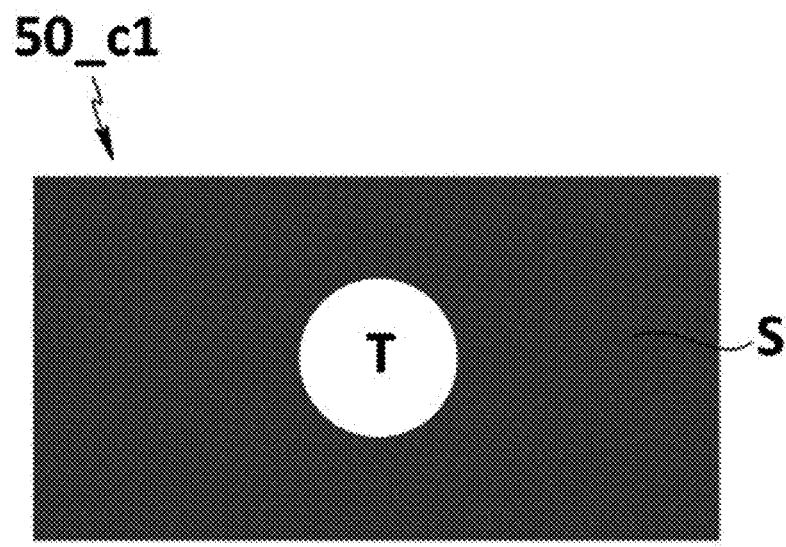
FIG. 7(a) shows transmittance of an optical mask for forming a light blocking member according to related art.
Figure 7B:
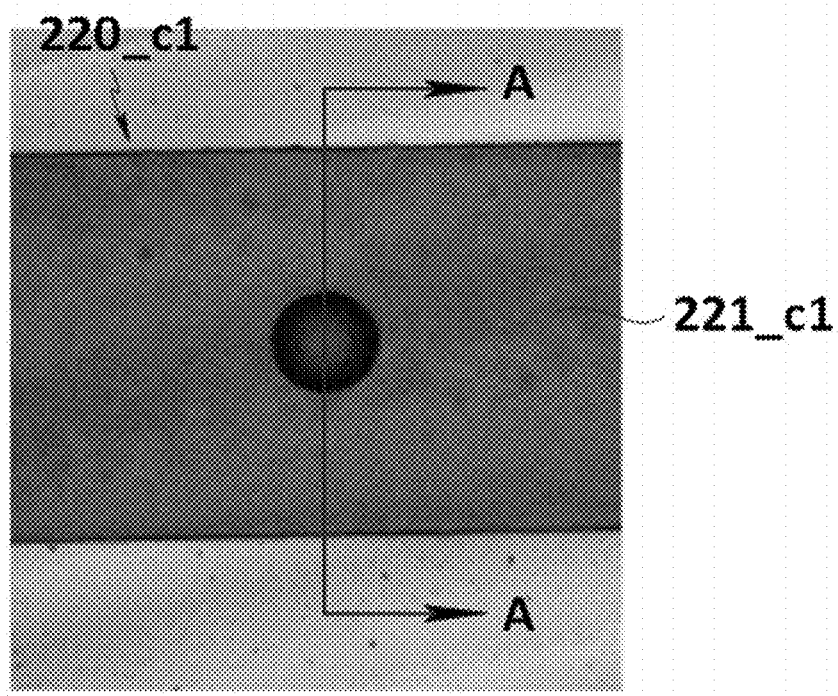
FIG. 7(b) shows a top plan view of a light blocking member formed by using an optical mask shown in FIG. 7(a)
Figure 7C:
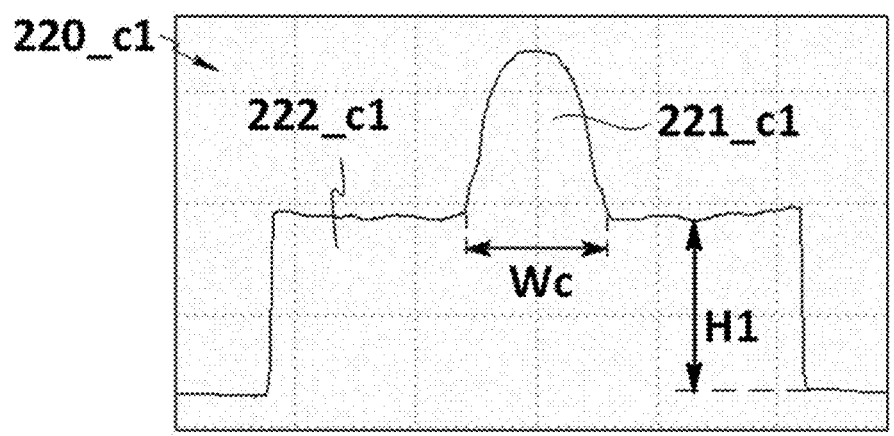
FIG. 7(c) shows a cross-sectional view of a light blocking member shown in FIG. 7 (b) with respect to a section line A-A.

An effect according to an exemplary embodiment will be described in comparison with related art with reference to FIG. 7(*a*), FIG. 7(*b*), FIG. 7(*c*), FIG. 8(*a*), FIG. 8(*b*), FIG. 8(*c*), FIG. 9(*a*), FIG. 9(*b*), and FIG. 9(*c*).

FIG. 7(*a*) shows transmittance of an optical mask for forming a light blocking member according to related art, FIG. 7(*b*) shows a top plan view of a light blocking member formed by using an optical mask shown in FIG. 7(*a*), and FIG. 7(*c*) shows a cross-sectional view of a light blocking member shown in FIG. 7(*b*) with respect to section line A-A. FIG. 8(*a*) shows transmittance of an optical mask for forming a light blocking member according to an exemplary embodiment, FIG. 8(*b*) shows a top plan view of a light blocking member formed by using an optical mask shown in FIG. 8(*a*), and FIG. 8(*c*) shows a cross-sectional view of a light blocking member shown in FIG. 8(*b*) with respect to section line B-B. FIG. 9(*a*) shows transmittance of an optical mask for forming a light blocking member according to an exemplary embodiment, FIG. 9(*b*) shows a top plan view of a light blocking member formed by using an optical mask shown in FIG. 9(*a*), and FIG. 9(*c*) shows a cross-sectional view of a light blocking member shown FIG. 9(*b*) with respect to section line C-C.

Referring to FIG. 7(*a*), an optical mask 50_c1 for forming a light blocking member includes a transparent region T in a portion corresponding to a region in which a spacer will be formed, and a half-tone region S is provided around the transparent region T.

Referring to FIGS. 7(*a*)-(*c*), if a light blocking material layer is exposed by using the optical mask 50_c1 shown in FIG. 7(*a*), a patterned light blocking member 220_c1 is formed. More specifically, the light blocking material layer corresponding to the transparent region T of the optical mask 50_c1 remains and forms a spacer 221_c1, and the light blocking material layer corresponding to the half-tone region S is partly removed to form a main light blocking portion 222_c1.

The thickness of the main light blocking portion 222_c1 formed in the above-noted manner may correspond to the thickness H1 of the main light blocking portion 222 of the light blocking member 220 shown in FIG. 2. However, the width We of the spacer 221_c1 becomes much greater than the width W4 of the spacer 221 shown in FIG. 2. This is because the half-tone region S is provided around the transparent region T and the light having passed through the half-tone region S influences the light blocking material layer corresponding to the transparent region T, which is different from a method for forming a spacer corresponding to the transparent region T by using an optical mask on which the opaque region is provided, and separately forming a light blocking member. A horizontal-directional size of the spacer 221_c1 taller than the main light blocking portion 222_c1 increases in comparison with the configurations illustrated in FIGS. 8(a)-(c) and FIGS. 9(a)-(c). For example, the horizontal-directional width (Wc) of the spacer 221_c1 is greater than 20 μm when the thickness of the main light blocking portion 222_c1 corresponds to the thickness H1. Therefore, the optical mask 50_c1 shown in FIGS. 7(a), 7(b), and 7(c) and the spacer 221_c1 formed by using the optical mask 50_c1 may not be appropriate for high-resolution display devices.

Figure 8A:
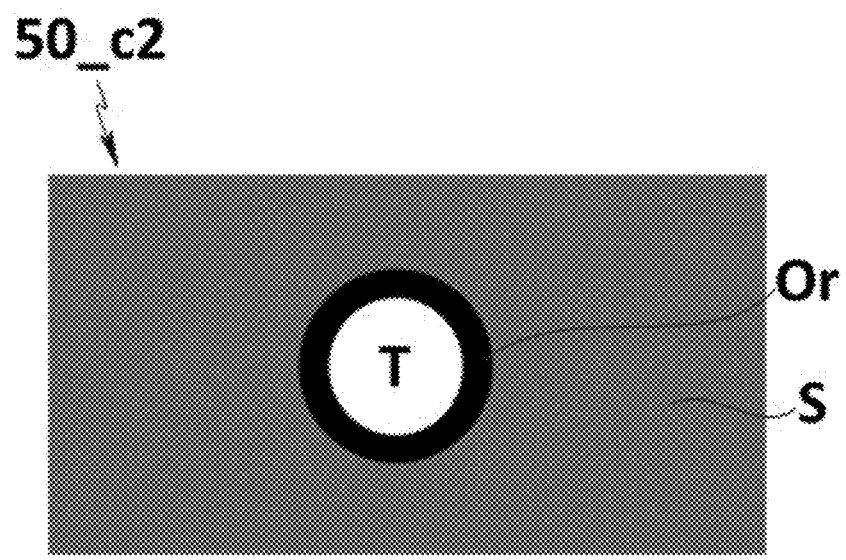
FIG. 8(a) shows transmittance of an optical mask for forming a light blocking member according to an exemplary embodiment.

Referring to FIG. 8(a), an optical mask 50_c2 for forming a light blocking member includes a transparent region T on a portion corresponding to the region in which a spacer will be formed, a ring-type opaque region (Or) is provided around the transparent region T, and a half-tone region S is provided outside the ring-type opaque region (Or).

Figure 8B:
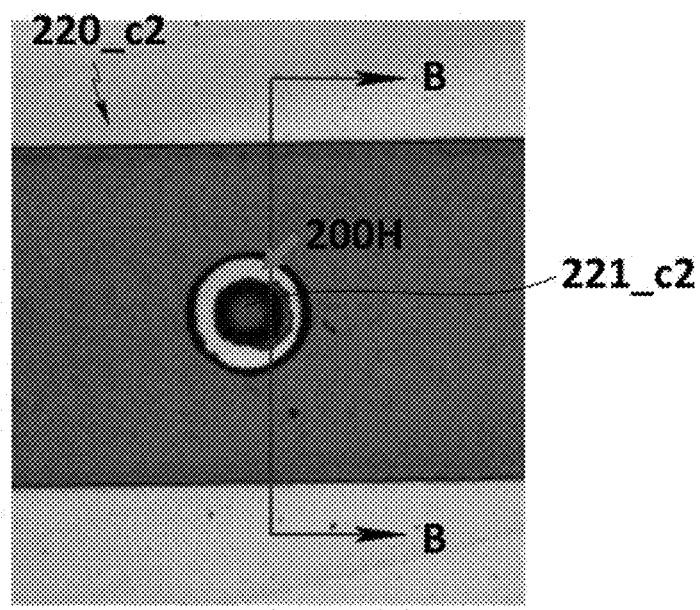
FIG. 8(b) shows a top plan view of a light blocking member formed by using an optical mask shown in FIG. 8(a)
Figure 8C:
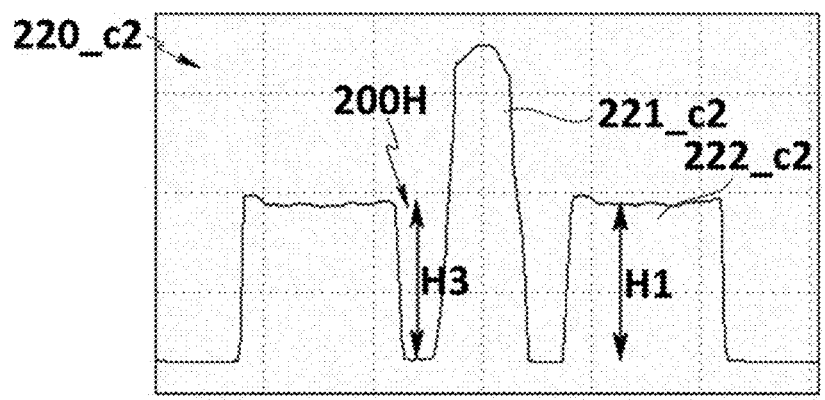
FIG. 8(c) shows a cross-sectional view of a light blocking member shown in FIG. 8(b) with respect to a section line B-B.

Referring to FIGS. 8(b) and 8(c), if the light blocking material layer is exposed by using an optical mask 50_c2 shown in FIG. 8(a), a light blocking member 220_c2 is formed. More specifically, the light blocking material layer corresponding to the transparent region T of the optical mask 50_c2 remains and forms a spacer 221_c2, the light blocking material layer corresponding to the half-tone region S is partly removed to form a main light blocking portion 222_c2, and the light blocking material layer corresponding to the ring-type opaque region (Or) is removed to form a deep furrow 200H around the spacer 221_c2.

The thickness of the main light blocking portion 222_c2 formed in the above-noted manner may correspond to the thickness H1 of the main light blocking portion 222 of the light blocking member 220 as shown in FIG. 2. However, a depth H3 of the deep furrow 200H becomes greater than about 50% of the thickness H1 of the main light blocking portion 222_c2 with respect to an upper surface of the main light blocking portion 222_c2. Therefore, the thickness of the main light blocking portion 222_c2 is substantially reduced, which may cause a problem of partial light leakage or insufficient light blocking function. However, at least the horizontal-directional width of the spacer 221_c2 may be substantially reduced to create a smaller spacer.

Figure 9A:
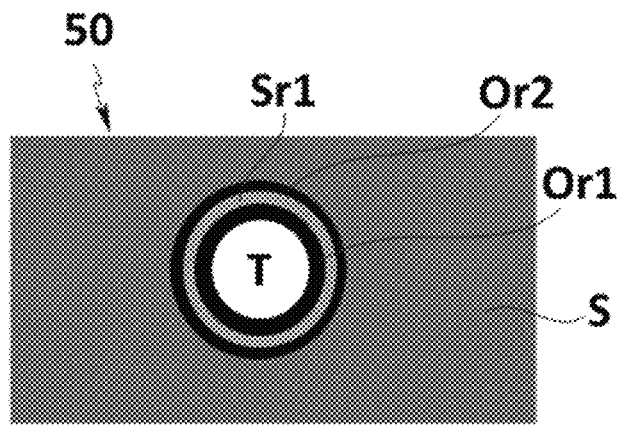
FIG. 9(a) shows transmittance of an optical mask for forming a light blocking member according to an exemplary embodiment.

FIG. 9(a) shows an optical mask 50 for forming a light blocking member similar to the configuration shown in FIG. 2. As described above, the optical mask 50 includes a transparent region T at a portion corresponding to a region in which a spacer 221 will be formed, at least two ring-type opaque regions Or1 and Or2 provided around the transparent region T, an intermediate half-tone region Sr1 provided between the ring-type opaque regions Or1 and Or2, and a half-tone region S provided outside the ring-type opaque region Or2.

Figure 9B:
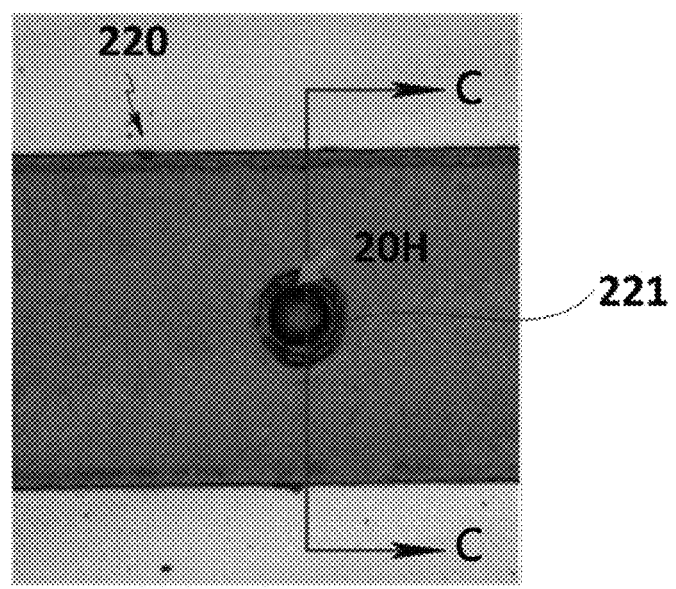
FIG. 9(b) shows a top plan view of a light blocking member formed by using an optical mask shown in FIG. 9(a)
Figure 9C:
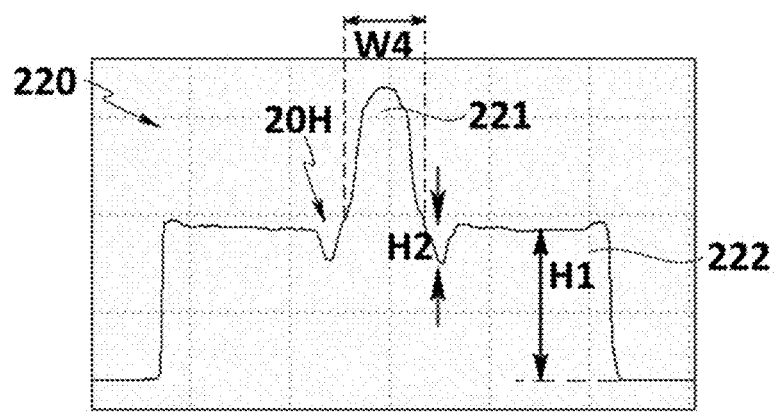
FIG. 9(c) shows a cross-sectional view of a light blocking member shown in FIG. 9(b) with respect to a section line C-C.

Referring to FIGS. 9(b) and 9(c), if the light blocking material layer is exposed by using the optical mask 50 shown in FIG. 9(a), a light blocking member 220 is formed. More specifically, the light blocking material layer corresponding to the transparent region T of the optical mask 50 remains to form a spacer 221, the light blocking material layer corresponding to the half-tone region S is partly removed to form a main light blocking portion 222, and the light blocking material layer corresponding to the ring-type opaque regions Or1 and Or2 and the intermediate half-tone region Sr1 is further removed than the main light blocking portion 222 to form a furrow 20H around the spacer 221. As described above, the depth H2 of the furrow 20H may be equal to or less than about 25% of the thickness H1 of the main light blocking portion 222 with respect to the upper surface of the main light blocking portion 222. Accordingly, the main light blocking portion 222 is prevented from becoming excessively thin and the horizontal-directional width W4 of the spacer 221 may be controlled and formed to be narrow enough so smaller spacers may be easily formed in the high-resolution display device.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device comprising:
    a first substrate and a second substrate facing the first substrate;
    a thin film transistor disposed on the first substrate;
    a first insulating layer disposed on the thin film transistor; and
    a light blocking member disposed on the first insulating layer,
    wherein the light blocking member includes a spacer for maintaining a cell gap between the first substrate and the second substrate and a main light blocking portion having an upper surface that is lower than an upper surface of the spacer,
    wherein the light blocking member further comprises a furrow at a border between the spacer and the main light blocking portion, the furrow having a surface lower than the upper surface of the main light blocking portion, and
    wherein the furrow entirely surrounds an edge of the spacer.

2. The display device of claim 1, wherein:
    a depth of the furrow is equal to or less than about 25% of a thickness of the main light blocking portion with reference to the upper surface of the main light blocking portion.

3. The display device of claim 2, wherein:
    the furrow has a closed curve surrounding the spacer.

4. The display device of claim 3, wherein:
    a width of the spacer is about 5 μm to about 15 μm.

5. The display device of claim 4, further comprising:
    a signal line connected to the thin film transistor,
    wherein the spacer overlaps at least one of the thin film transistor and the signal line.

6. The display device of claim 5, wherein:
    the main light blocking portion overlaps at least a portion of the signal line.

7. The display device of claim 1, further comprising:
    a pixel electrode disposed on the thin film transistor and connected to the thin film transistor,
    wherein the light blocking member is disposed on the pixel electrode.

8. The display device of claim 1, wherein:
    at least some portion of the furrow is disposed on a region in which the thin film transistor is disposed.

9. The display device of claim 1, wherein:
    the furrow is disposed at an edge of the spacer and surrounds the edge of the spacer.

10. The display device of claim 1, wherein:
    the surface of the furrow is an upper surface of the furrow; and
    the upper surface of the furrow is lower than the upper surface of the main light blocking portion.

11. A display device comprising:
a first substrate and a second substrate facing the first substrate;
a thin film transistor disposed on the first substrate;
a first insulating layer disposed on the thin film transistor; and
a light blocking member disposed on the first insulating layer,
wherein the light blocking member includes a spacer for maintaining a cell gap between the first substrate and the second substrate and a main light blocking portion having an upper surface that is lower than an upper surface of the spacer,
wherein the light blocking member further comprises a furrow at a border between the spacer and the main light blocking portion, the furrow having an upper surface lower than the upper surface of the main light blocking portion, and
wherein at least some portion of the furrow is disposed above the thin film transistor when viewed from a direction perpendicular to an upper surface of the second substrate.

12. The display device of claim 11, wherein:
the furrow is contacts the spacer.

13. The display device of claim 11, wherein:
the furrow is disposed around an edge of the spacer.

* * * * *